(12) United States Patent
Jacob

(10) Patent No.: US 9,953,882 B2
(45) Date of Patent: Apr. 24, 2018

(54) METHOD FOR FORMING NANOWIRES INCLUDING MULTIPLE INTEGRATED DEVICES WITH ALTERNATE CHANNEL MATERIALS

(71) Applicant: GLOBALFOUNDRIES Inc., Grand Cayman (KY)

(72) Inventor: Ajey P. Jacob, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/792,281

(22) Filed: Oct. 24, 2017

(65) Prior Publication Data

US 2018/0090387 A1    Mar. 29, 2018

Related U.S. Application Data

(62) Division of application No. 15/279,732, filed on Sep. 26, 2016, now Pat. No. 9,831,131.

(51) Int. Cl.
| | |
|---|---|
| H01L 29/78 | (2006.01) |
| H01L 21/8238 | (2006.01) |
| H01L 29/06 | (2006.01) |
| H01L 29/786 | (2006.01) |
| H01L 29/423 | (2006.01) |
| H01L 27/092 | (2006.01) |

(52) U.S. Cl.
CPC ........... *H01L 21/823807* (2013.01); *H01L 21/823814* (2013.01); *H01L 21/823871* (2013.01); *H01L 21/823878* (2013.01); *H01L 27/092* (2013.01); *H01L 29/0649* (2013.01); *H01L 29/0673* (2013.01); *H01L 29/42392* (2013.01); *H01L 29/78618* (2013.01); *H01L 29/78654* (2013.01); *H01L 29/78684* (2013.01); *H01L 29/78696* (2013.01)

(58) Field of Classification Search
CPC ..... H01L 21/823814; H01L 21/823871; H01L 21/823878; H01L 27/092; H01L 29/0649; H01L 29/0673; H01L 29/42392; H01L 29/78618; H01L 29/78654; H01L 29/78684; H01L 29/78696
See application file for complete search history.

(56) References Cited

U.S. PATENT DOCUMENTS

2016/0240533 A1* 8/2016 Oxland ............... H01L 27/092

* cited by examiner

*Primary Examiner* — Daniel Shook
(74) *Attorney, Agent, or Firm* — Ditthavong & Steiner, P.C.

(57) ABSTRACT

Methods for forming a NW with multiple devices having alternate channel materials and resulting devices are disclosed. Embodiments include forming a first stack of semiconductor layers including a first doped Si layer, a first channel layer, and a second doped Si layer, respectively, on a Si substrate; forming a second stack including a first doped SiGe layer, a second channel layer, and a second doped SiGe layer, respectively, on the first stack; forming a vertical nanowire structure by directional etching, along a three-dimensional plane, the second and first stacks, respectively, down to an upper surface of the Si substrate; forming lower S/D regions and a lower gate-stack surrounding the first stack; forming upper S/D regions and an upper gate-stack surrounding the second stack; and forming contacts to the lower S/D regions, a first gate electrode, an upper S/D region, an upper gate electrode, and the second doped SiGe layer.

20 Claims, 19 Drawing Sheets

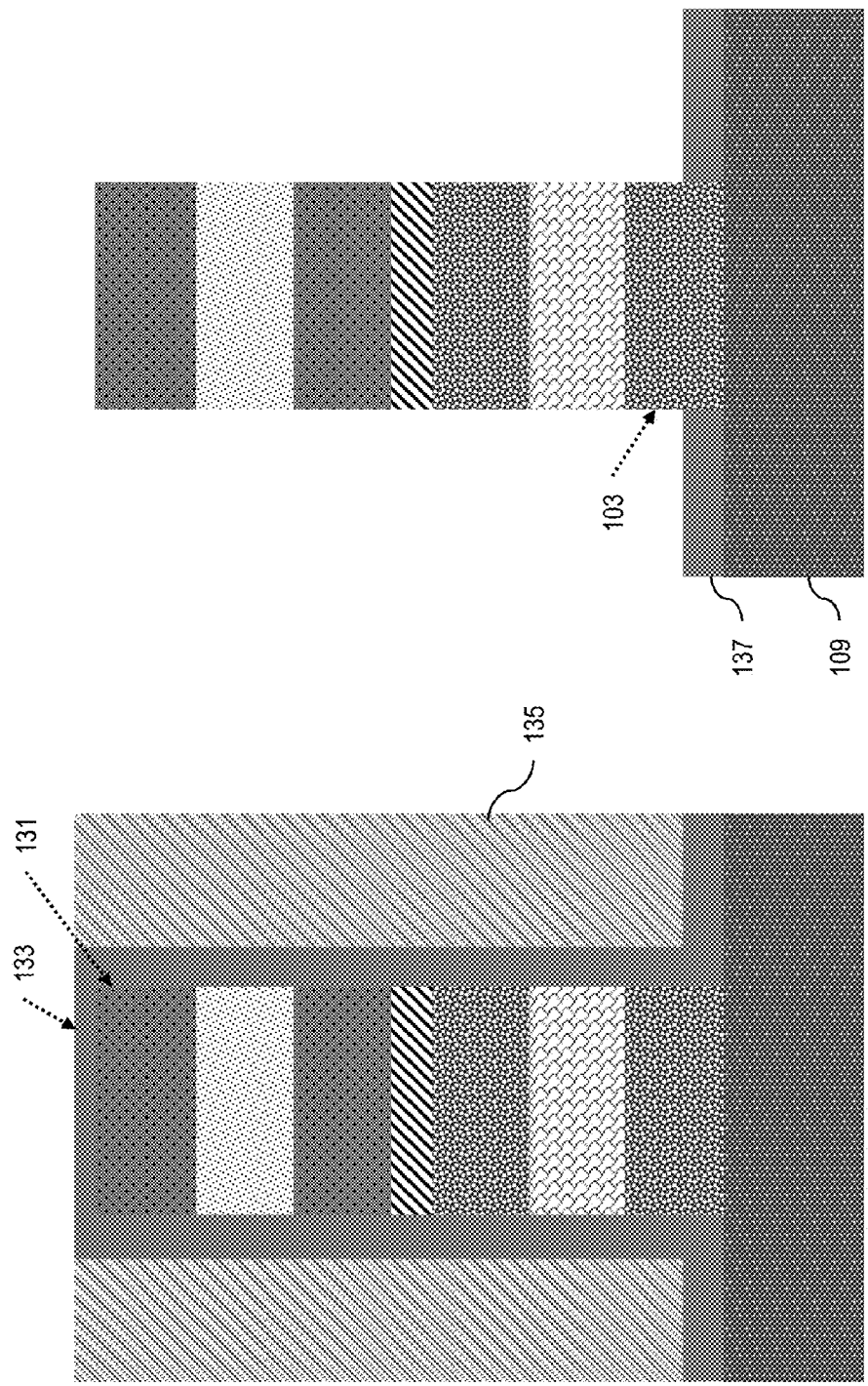

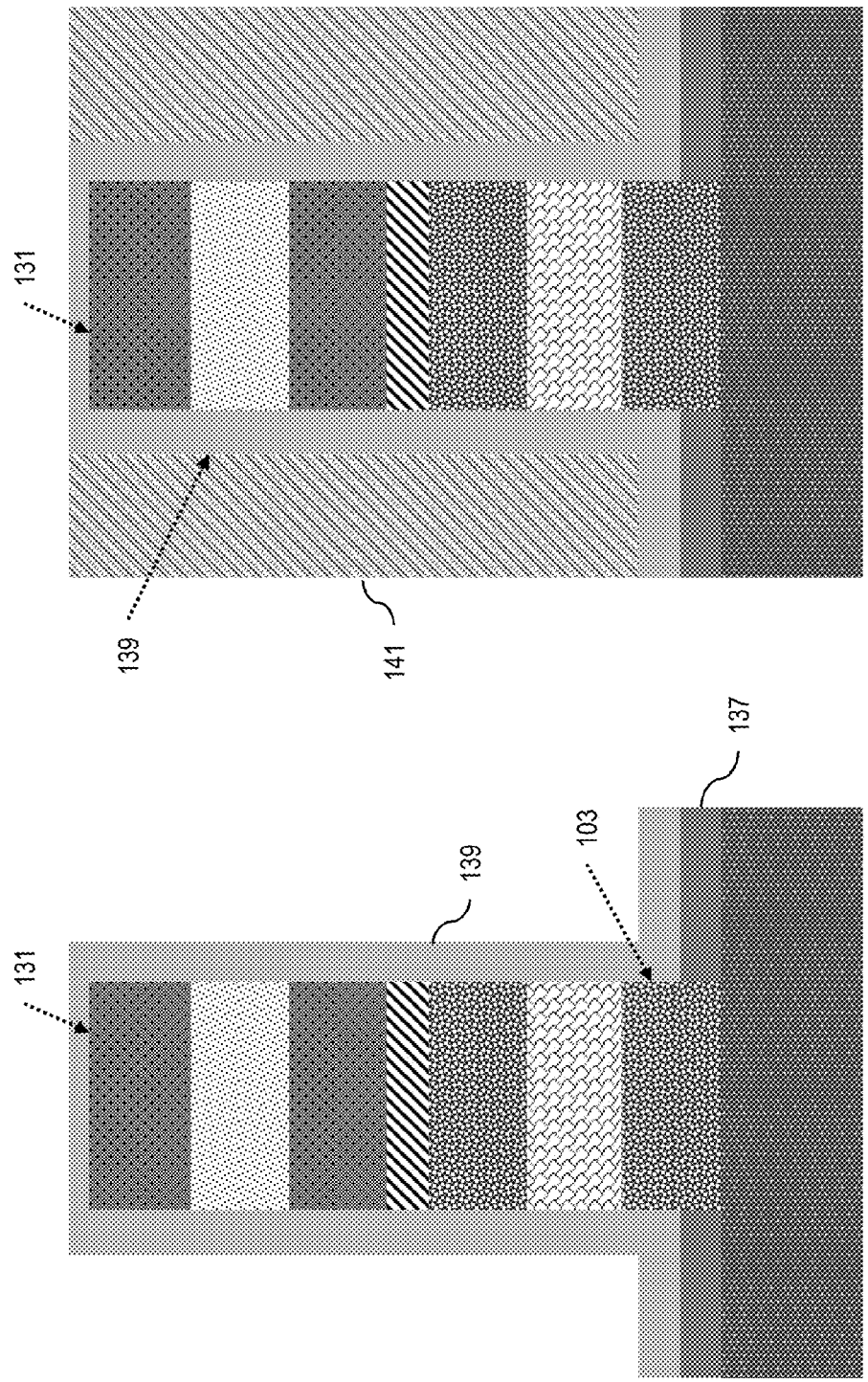

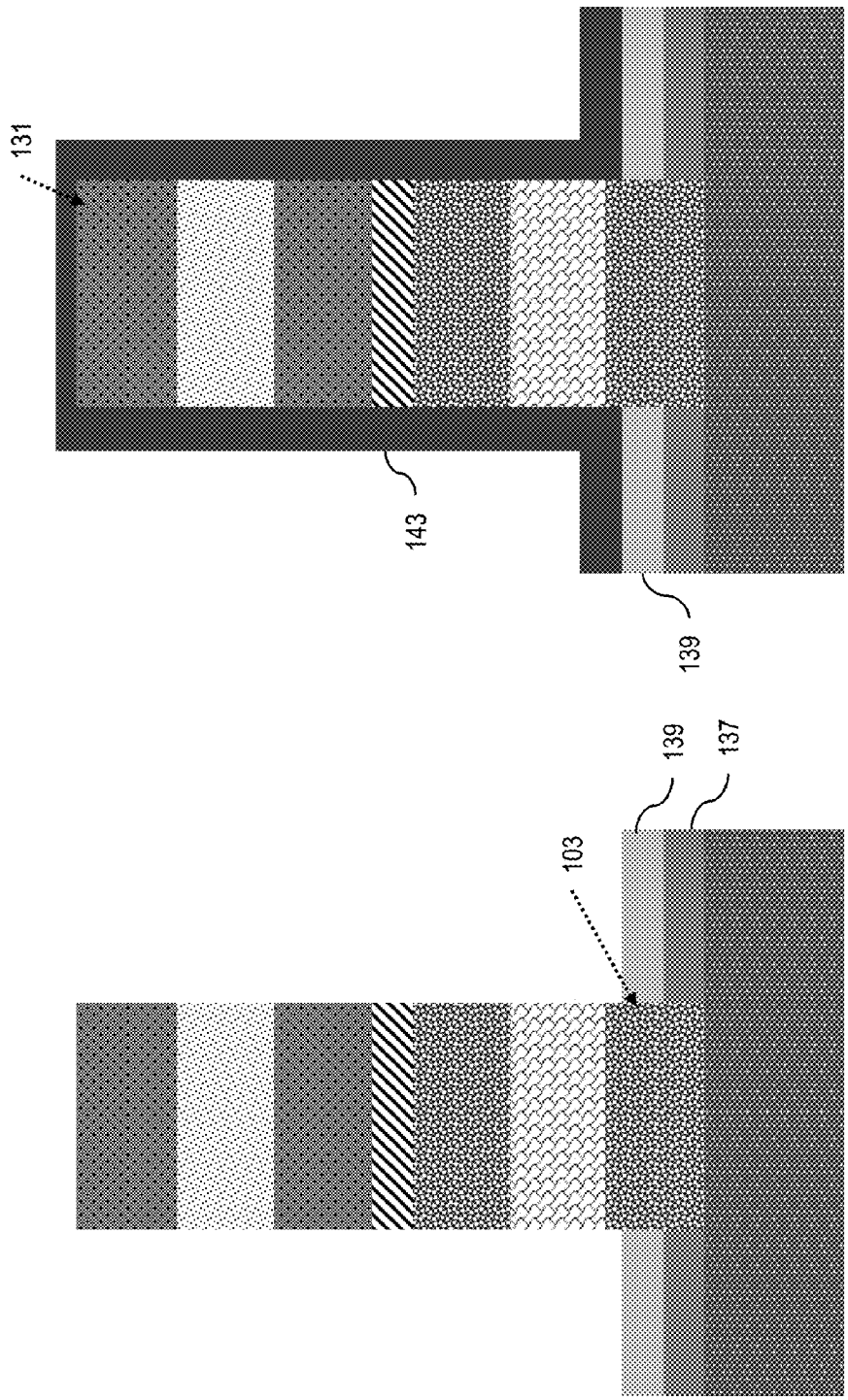

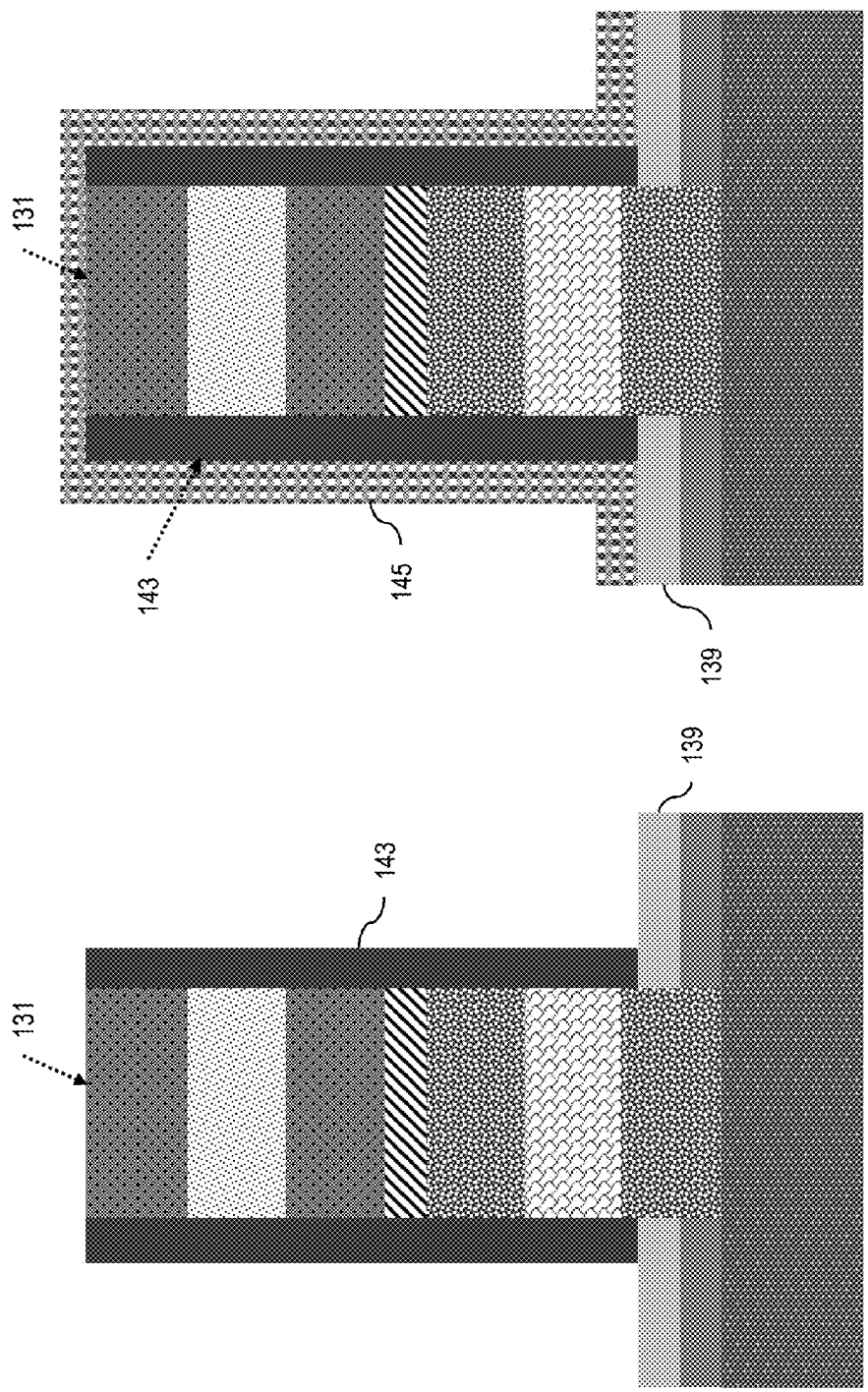

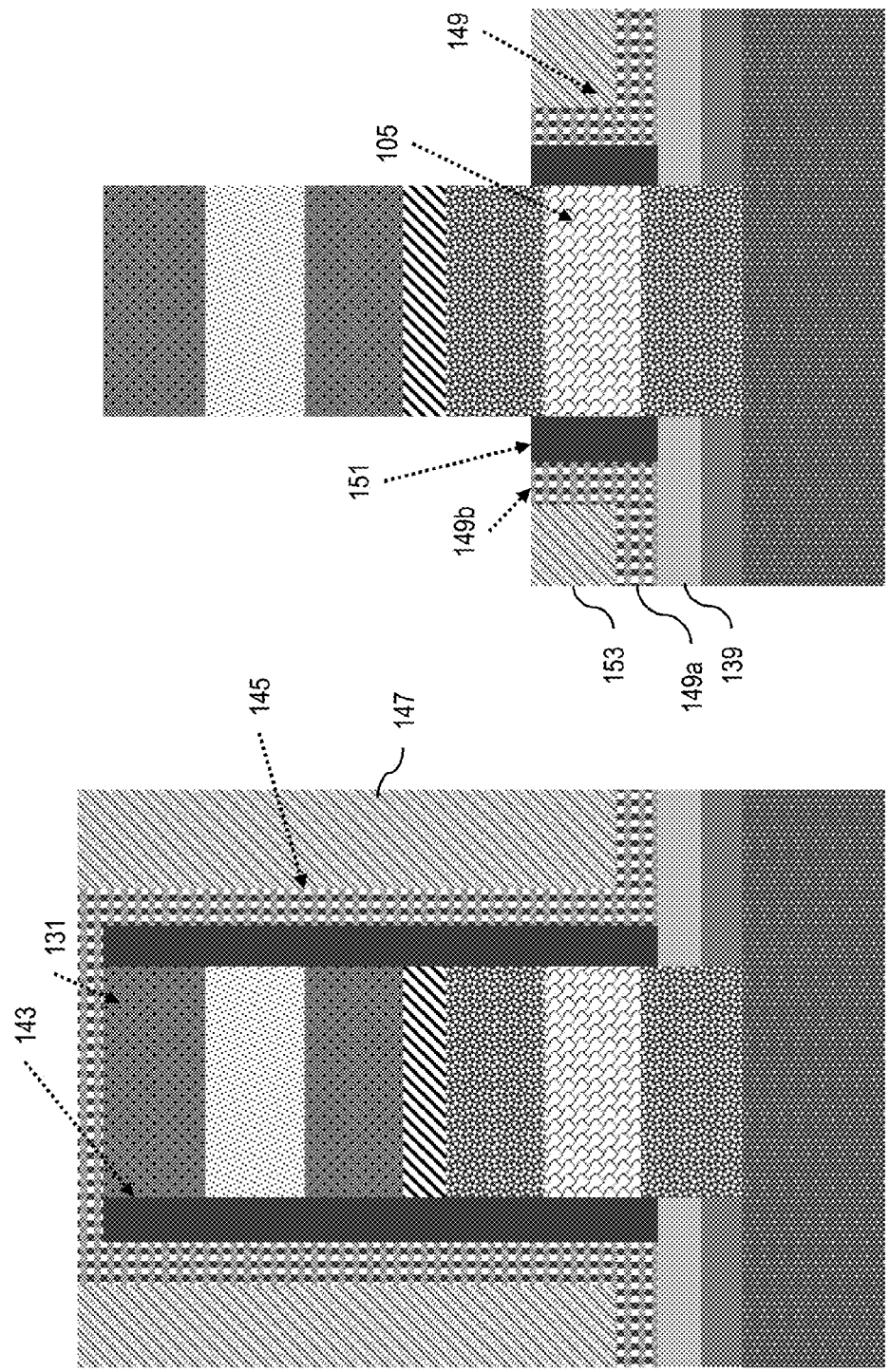

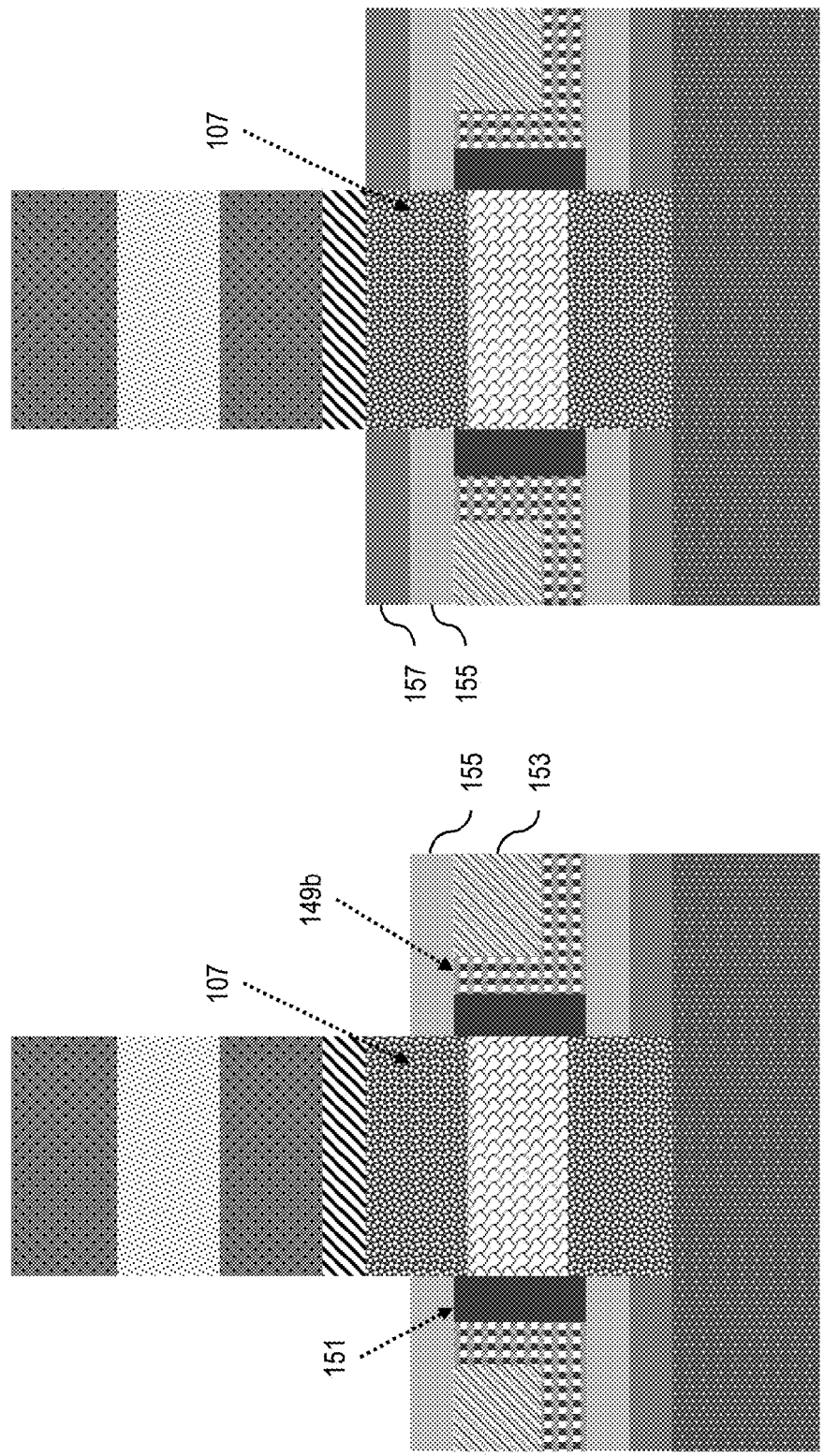

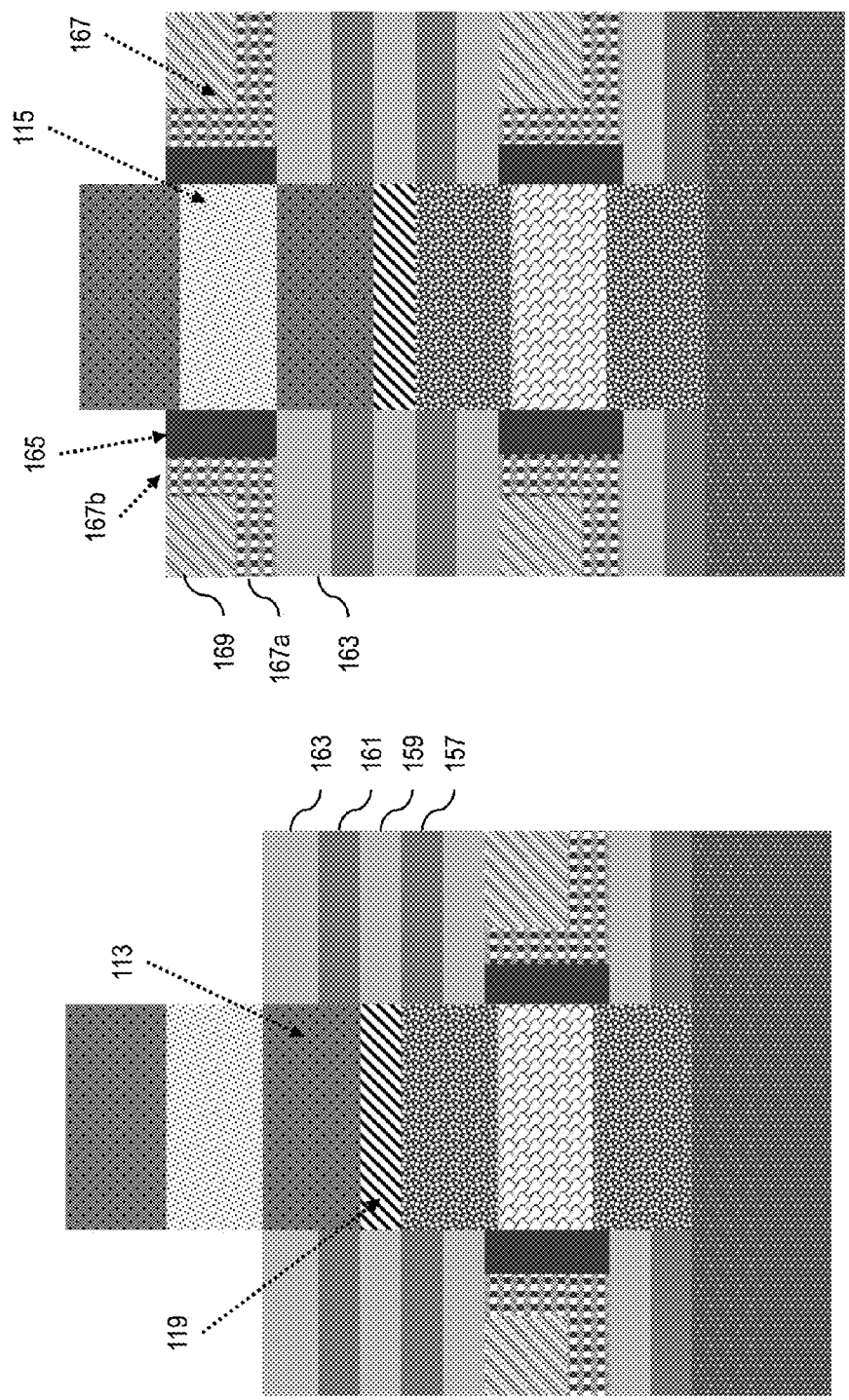

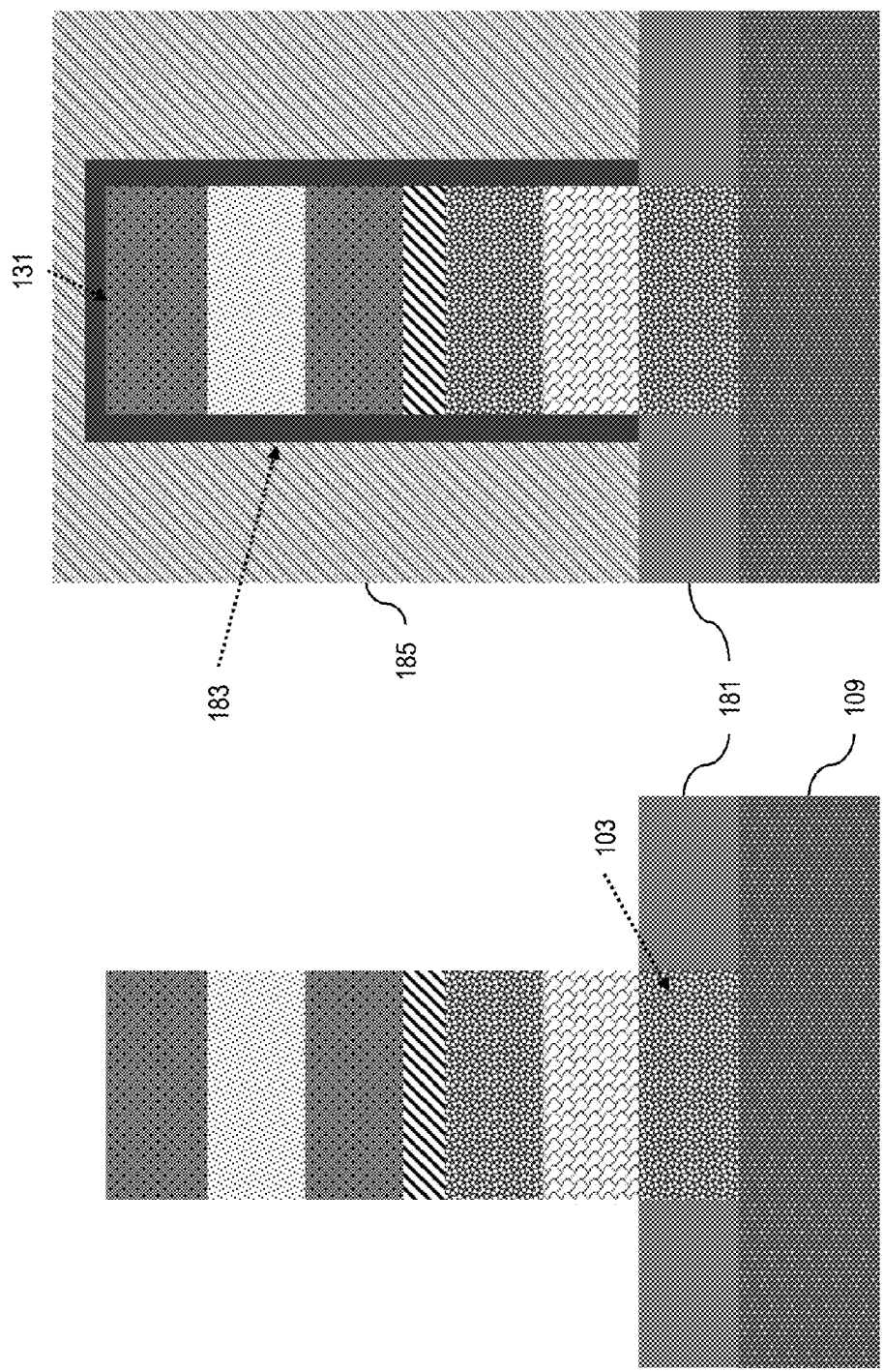

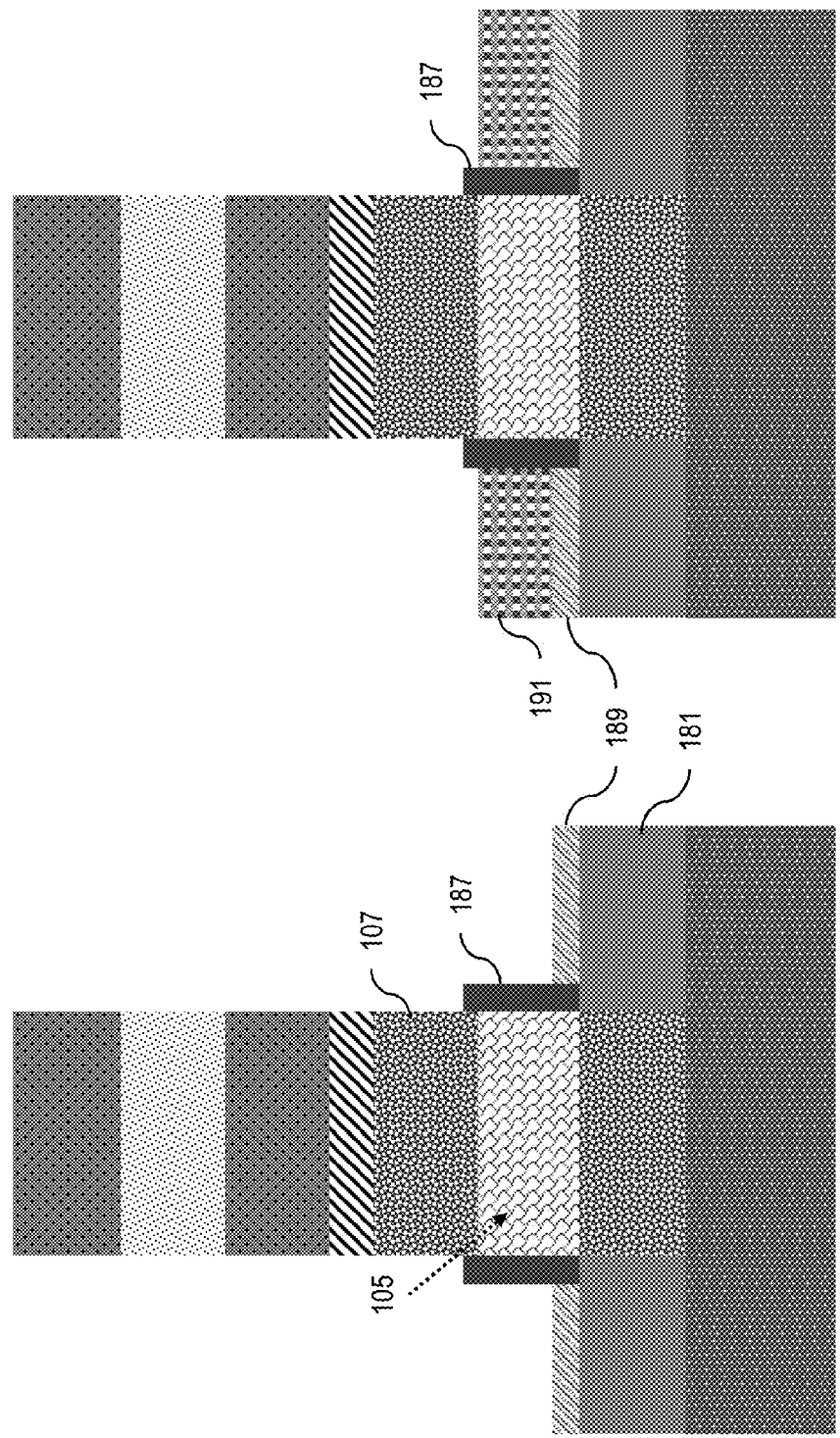

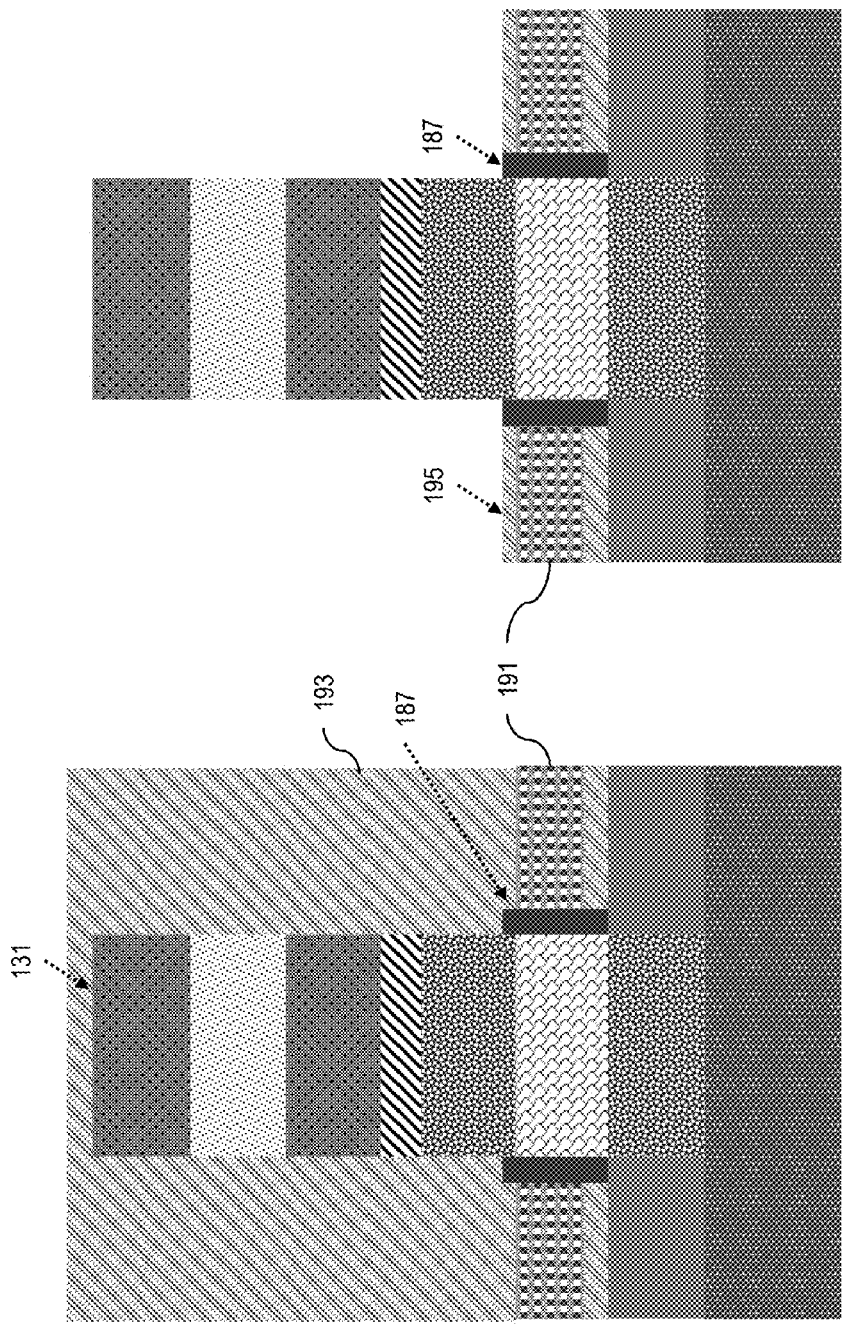

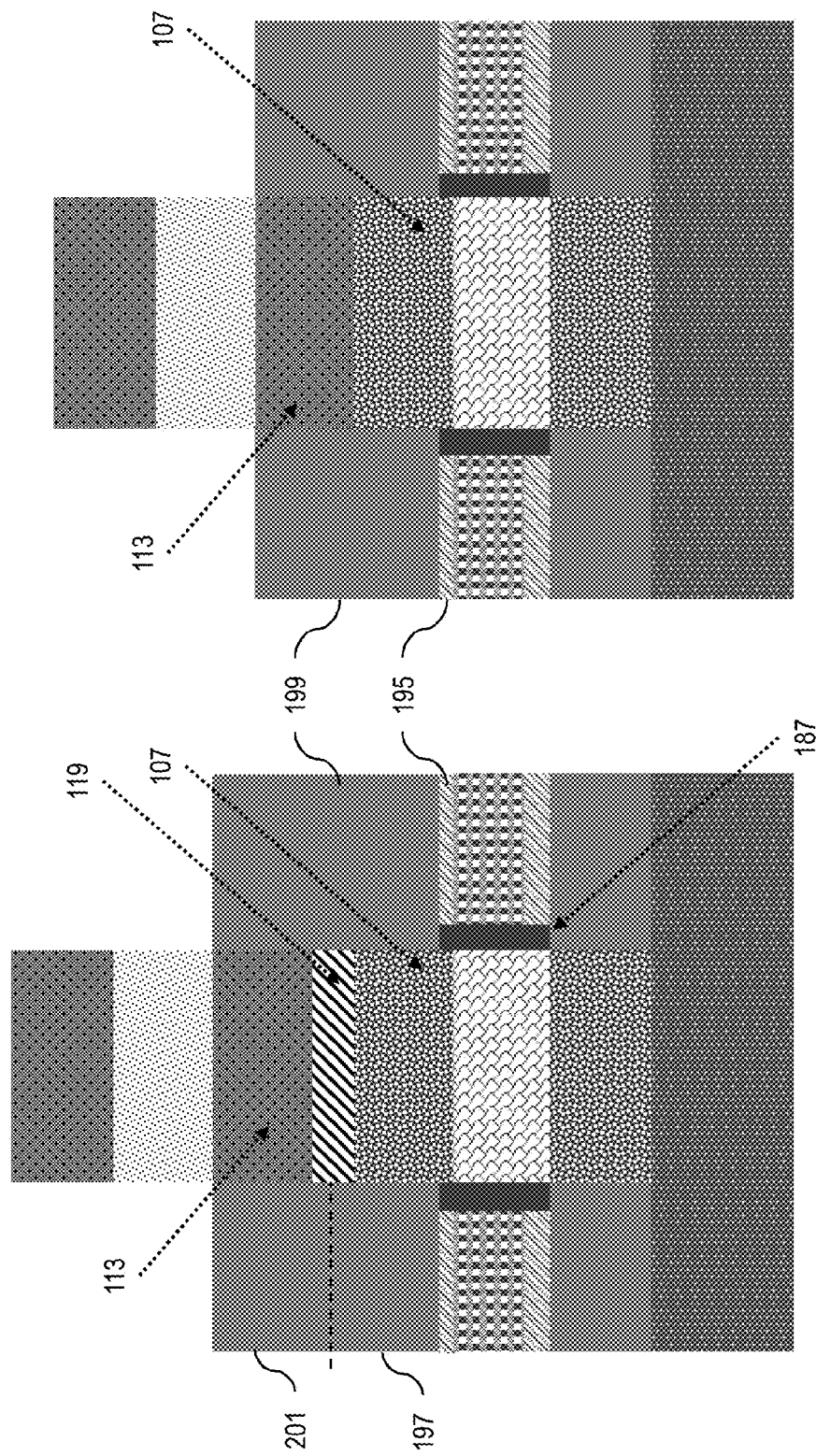

US 9,953,882 B2

METHOD FOR FORMING NANOWIRES INCLUDING MULTIPLE INTEGRATED DEVICES WITH ALTERNATE CHANNEL MATERIALS

RELATED APPLICATION

This application is a divisional of U.S. patent application Ser. No. 15/279,732, filed Sep. 29, 2016, entitled "METHOD FOR FORMING NANOWIRES INCLUDING MULTIPLE INTEGRATED DEVICES WITH ALTERNATE CHANNEL MATERIALS," which is incorporated herein by reference in its entirety.

TECHNICAL FIELD

The present disclosure relates generally to designing and fabricating integrated circuit (IC) devices. The present disclosure is particularly applicable to forming multiple devices integrated on a nanowire (NW) in the 10 nanometer (nm) technology node and beyond.

BACKGROUND

Advanced processes and techniques may be employed in design and fabrication of IC devices, particularly to aid with reducing the geometries of components and structures utilized to scale down IC devices beyond 10 nm. Scaling IC devices requires improvements in power, performance, and density. Improvement in performance may require transport in ballistic regime, full quantization of the channel, and sub 10 nm nanowires with gate all round structures for full quantization. Scaling beyond 10 nm would require nonplanar NW structures to meet density requirements. However, such scaling would require integrated devices on a NW having alternate channel materials to meet the power-performance requirements.

A need therefore exists for a methodology for forming a NW with multiple devices having alternate channel materials and the resulting device.

SUMMARY

An aspect of the present disclosure is a method of forming a NW with multiple devices having alternate channel materials in an IC device.

Another aspect of the present disclosure is an IC device including a NW with multiple devices having alternate channel materials.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming a first stack of semiconductor layers including a first doped silicon (Si) layer, a first channel layer, and a second doped Si layer, respectively, on a Si substrate; forming a second stack of semiconductor layers including a first doped silicon-germanium (SiGe) layer, a second channel layer, and a second doped SiGe layer, respectively, on the first stack; forming a vertical nanowire structure by directional etching, along a three-dimensional plane, the second and first stacks, respectively, down to an upper surface of the Si substrate; forming lower source/drain (S/D) regions and a lower gate-stack surrounding the first stack; forming upper S/D regions and an upper gate-stack surrounding the second stack; and forming contacts to the lower S/D regions, a first gate electrode, an upper S/D region, an upper gate electrode, and the second doped SiGe layer.

One aspect includes forming a middle layer separating the first and second stacks, wherein forming the lower S/D regions and lower gate-stack include forming a first lower S/D region, on the upper surface of the Si substrate, surrounding a vertical section of exposed surfaces of the first doped Si layer; forming a first low-k dielectric, on an upper surface of the first lower S/D region, surrounding another vertical section of the exposed surfaces of the first doped Si layer; forming a first gate dielectric on exposed surfaces of the first channel layer; forming the first gate electrode having a horizontal portion on an exposed upper surface of the first low-k dielectric and a vertical portion on exposed side surfaces of the first gate dielectric; forming a first isolation layer on an upper surface of the horizontal portion of the first gate electrode, coplanar with a top of the vertical portion of the first gate electrode; forming a second low-k dielectric, on the top of the vertical portion of the first gate electrode, the first gate dielectric, and an upper surface of the first isolation layer, surrounding a vertical section of exposed surfaces of the second doped Si layer; and forming a second lower S/D region, on an upper surface of the second low-k dielectric, surrounding exposed surfaces of the second doped Si layer.

In another aspect, forming the upper S/D regions and upper gate-stack includes forming a third low-k dielectric, on an upper surface of the second lower S/D region, surrounding the middle layer; forming a first upper S/D region, on an upper surface of the third low-k dielectric, surrounding a vertical section of the first doped SiGe layer; forming a fourth low-k dielectric, on an upper surface of the first upper S/D region, surrounding another vertical section of the first doped SiGe layer; forming a second gate dielectric on exposed surfaces of the second channel layer; forming the second gate electrode having a horizontal portion on an exposed upper surface of the fourth low-k dielectric and a vertical portion on exposed side surfaces of the second gate dielectric; forming a second isolation layer on an upper surface of the horizontal portion of the second gate electrode coplanar with a top of the vertical portion of the second gate electrode; forming a fifth low-k dielectric, on the top of the vertical portion of the second gate electrode, the second gate dielectric, and an upper surface of the second isolation layer, surrounding a vertical section of the second doped SiGe layer; and forming a metal layer over the fifth low-k dielectric and over and surrounding exposed surfaces of the second doped SiGe layer.

In a further aspect, forming the contacts includes forming a trench to each of the first and second lower S/D regions, the first and second gate electrodes, the first upper S/D region, and the second doped SiGe layer; forming an isolation dielectric on sidewalls of the trenches; and filling the trenches with a conductive metal.

In an additional aspect, forming the lower S/D regions and lower gate stack includes forming a first lower S/D region, on the upper surface of the Si substrate, surrounding the first doped Si layer; forming a first gate dielectric on exposed surfaces of the first channel layer and sections of the first and second doped Si layers adjacent the first channel layer; forming a first isolation layer, on an exposed upper surface of the first lower S/D region, surrounding a lower vertical section of the first gate dielectric; forming the first gate electrode, on an exposed upper surface of the first isolation layer, surrounding exposed side surfaces of the first gate dielectric; forming a second isolation layer, on an upper surface of the first gate electrode, coplanar with an upper surface of the first gate dielectric; and forming a second lower S/D region on an upper surface of the second isolation layer and an exposed upper surface of the first gate dielectric.

In one aspect, forming the upper S/D regions and upper gate stack includes forming the second lower S/D region surrounding the second doped Si layer and the first doped SiGe layer, forming joined second lower and first upper S/D regions; forming a second gate dielectric on exposed surfaces of the second channel layer; forming a third isolation layer, on an exposed upper surface of the joined S/D region, surrounding a lower vertical section of the second gate dielectric; forming the second gate electrode, on an exposed upper surface of the second isolation layer, surrounding exposed side surfaces of the second gate dielectric; forming a fourth isolation layer, on an upper surface of the second gate electrode and an exposed upper surface of the second gate dielectric, surrounding a lower section of the second doped SiGe layer; and forming a second upper S/D region, on an upper surface of the fourth isolation layer, coplanar with and surrounding exposed surfaces of the second doped SiGe layer.

One aspect includes forming a middle layer of carbon-doped Si layer separating the first and second stacks.

In another aspect, forming the contacts includes forming a trench to each of the first lower S/D region, the joined S/D region, the first and second gate electrodes, and the second doped SiGe layer; forming an isolation dielectric on sidewalls of the trenches; and filling the trenches with a conductive metal.

Another aspect of the present disclosure includes a device including: a vertical nanowire structure, along a three-dimensional plane, including a first stack of semiconductor layers including a first doped Si layer, a first channel layer, and a second doped Si layer, respectively, on a Si substrate; a second stack of semiconductor layers including a first doped SiGe layer, a second channel layer, and a second doped SiGe layer, respectively, on the first stack; lower S/D regions and a lower gate-stack surrounding the first stack; upper S/D regions and an upper gate-stack surrounding the second stack; and contacts connected to the lower S/D regions, a first gate electrode, an upper S/D region, an upper gate electrode, and the second doped SiGe layer.

One aspect includes a middle layer separating the first and second stacks, wherein the lower S/D regions and lower gate-stack include a first lower S/D region, on the upper surface of the Si substrate, surrounding a vertical section of exposed surfaces of the first doped Si layer; a first low-k dielectric, on an upper surface of the first lower S/D region, surrounding another vertical section of the exposed surfaces of the first doped Si layer; a first gate dielectric on exposed surfaces of the first channel layer, wherein the first gate electrode includes a horizontal portion on an exposed upper surface of the first low-k dielectric and a vertical portion on exposed side surfaces of the first gate dielectric; a first isolation layer on an upper surface of the horizontal portion of the first gate electrode, coplanar with a top of the vertical portion of the first gate electrode; a second low-k dielectric on the top of the vertical portion of the first gate electrode, the first gate dielectric, and an upper surface of the first isolation layer, surrounding a vertical section of exposed surfaces of the second doped Si layer; and a second lower S/D region, on an upper surface of the second low-k dielectric, surrounding exposed surfaces of the second doped Si layer.

In another aspect, the upper S/D regions and upper gate-stack include a third low-k dielectric, on an upper surface of the second lower S/D region, surrounding the middle layer; a first upper S/D region, on an upper surface of the third low-k dielectric, surrounding a vertical section of the first doped SiGe layer; a fourth low-k dielectric, on an upper surface of the first upper S/D region, surrounding another vertical section of the first doped SiGe layer; a second gate dielectric on exposed surfaces of the second channel layer, wherein the second gate electrode includes a horizontal portion on an exposed upper surface of the fourth low-k dielectric and a vertical portion on exposed side surfaces of the second gate dielectric; a second isolation layer on an upper surface of the horizontal portion of the second gate electrode coplanar with a top of the vertical portion of the second gate electrode; a fifth low-k dielectric, on the top of the vertical portion of the second gate electrode, the second gate dielectric, and an upper surface of the second isolation layer, surrounding a vertical section of the second doped SiGe layer; and a metal layer over the fifth low-k dielectric and over and surrounding exposed surfaces of the second doped SiGe layer.

In an additional aspect, the contacts include a trench extending to each of the first and second lower S/D regions, the first and second gate electrodes, the first upper S/D region, and the second doped SiGe layer; an isolation dielectric on sidewalls of the trenches; and a conductive metal filling each trench.

In one aspect, the lower S/D regions and lower gate stack include a first lower S/D region, on the upper surface of the Si substrate, surrounding the first doped Si layer; a first gate dielectric on exposed surfaces of the first channel layer and sections of the first and second doped Si layers adjacent the first channel layer; a first isolation layer, on an exposed upper surface of the first lower S/D region, surrounding a lower vertical section of the first gate dielectric, wherein the first gate electrode is formed, on an exposed upper surface of the first isolation layer, surrounding exposed side surfaces of the first gate dielectric; a second isolation layer, on an upper surface of the first gate electrode, coplanar with an upper surface of the first gate dielectric; and a second lower S/D region on an upper surface of the second isolation layer and an exposed upper surface of the first gate dielectric.

In a further aspect, the upper S/D regions and upper gate stack include the second lower S/D region surrounding the second doped Si layer and the first doped SiGe layer, forming joined second lower and first upper S/D regions; a second gate dielectric on exposed surfaces of the second channel layer; a third isolation layer, on an exposed upper surface of the joined S/D region, surrounding a lower vertical section of the second gate dielectric, wherein the second gate electrode is formed, on an exposed upper surface of the second isolation layer, surrounding exposed side surfaces of the second gate dielectric; a fourth isolation layer, on an upper surface of the second gate electrode and an exposed upper surface of the second gate dielectric, surrounding a lower section of the second doped SiGe layer; and a second upper S/D region, on an upper surface of the fourth isolation layer, coplanar with and surrounding exposed surfaces of the second doped SiGe layer.

One aspect includes a middle layer of carbon-doped Si layer separating the first and second stacks.

In an additional aspect, the contacts include a trench extending to each of the first lower S/D region, the joined S/D region, the first and second gate electrodes, and the second doped SiGe layer; an isolation dielectric on sidewalls of the trenches; and a conductive metal filling each trench.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of insufficient power, performance, and density attendant upon scaling IC devices in 10 nm technology node and beyond. The present disclosure addresses and solves such problems, for instance, by, inter alia, forming a NW with multiple devices having alternate channel materials.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
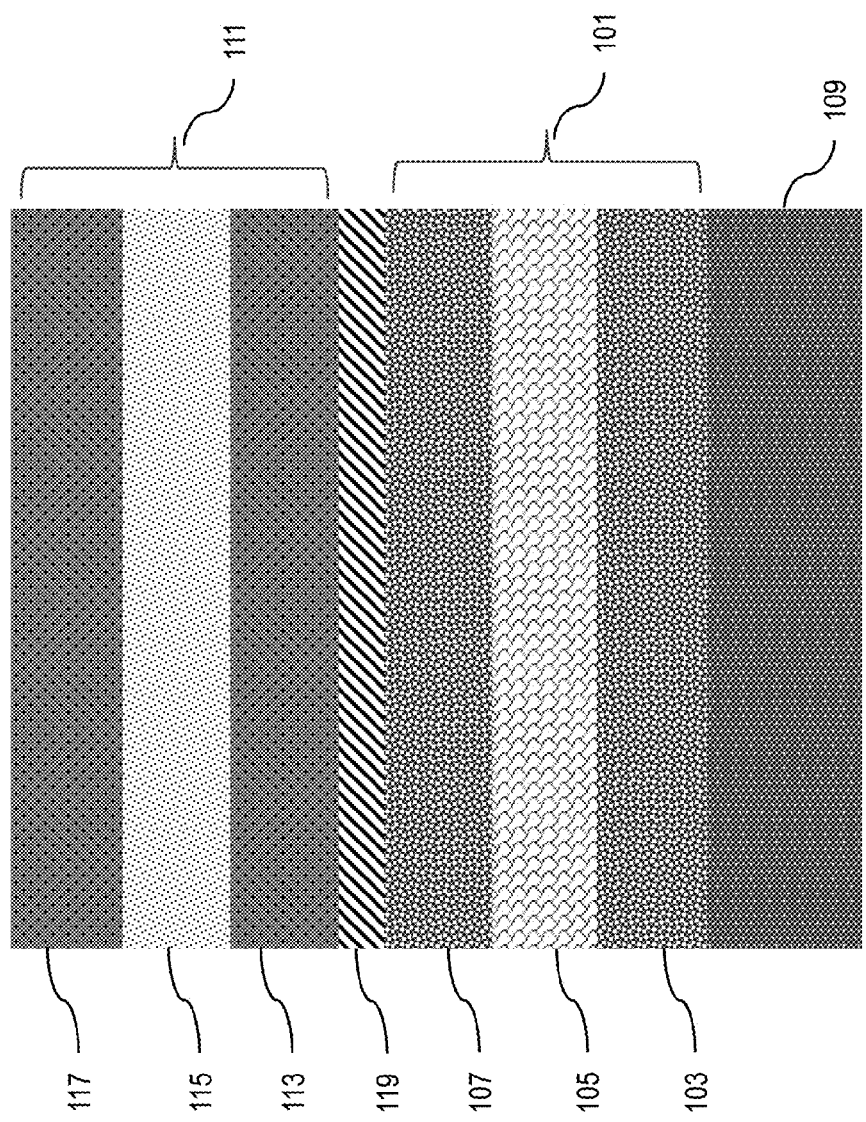
FIGS. 1A, 1C through 1U, 1V through 1Z, and 1AA through 1AG illustrate cross sectional views of process steps for forming a NW with multiple devices having alternate channel materials, in accordance with an exemplary embodiment.

FIG. 1A illustrates a cross sectional view of a semiconductor stack where a stack 101 including a first doped (e.g. phosphorus (P)) Si layer 103, a first Si channel layer 105, and a second P-doped Si or silicon-carbon layer 107 is formed on a Si substrate 109, wherein the P-doping may be done during the growth process (e.g. in-situ) or by an implant process. A stack 111 including a first doped (e.g. boron (B)) SiGe layer 113, a strained SiGe channel layer 115, and a second B-doped SiGe layer 117 may be formed on a carbon-doped Si middle layer 119 that separates the 101 and 111 stacks. The B-doping may be done during the growth process (e.g. in-situ) or by an implant process. The SiGe layers 113 and 117 may have a same percentage of Ge, which may be different from the percentage of Ge in the SiGe layer 115 making the SiGe layer 115 strained. If the percentage of Ge in the SiGe layer 115 is lower than that in the SiGe layers 113 and 117, then the SiGe layer 115 will have a higher strain. Alternatively, the SiGe layers 113, 115, and 117 may all have the same percentage of Ge, and there will be no strain on the layer 115. The stacks may be formed by growing pseudomorphic heterostructures of Si/SiGe, wherein the stack 101 may be used to form a n-type device (e.g. NMOS) and the stack 111 may be used to form a p-type device (e.g. PMOS).

Figure 1B:
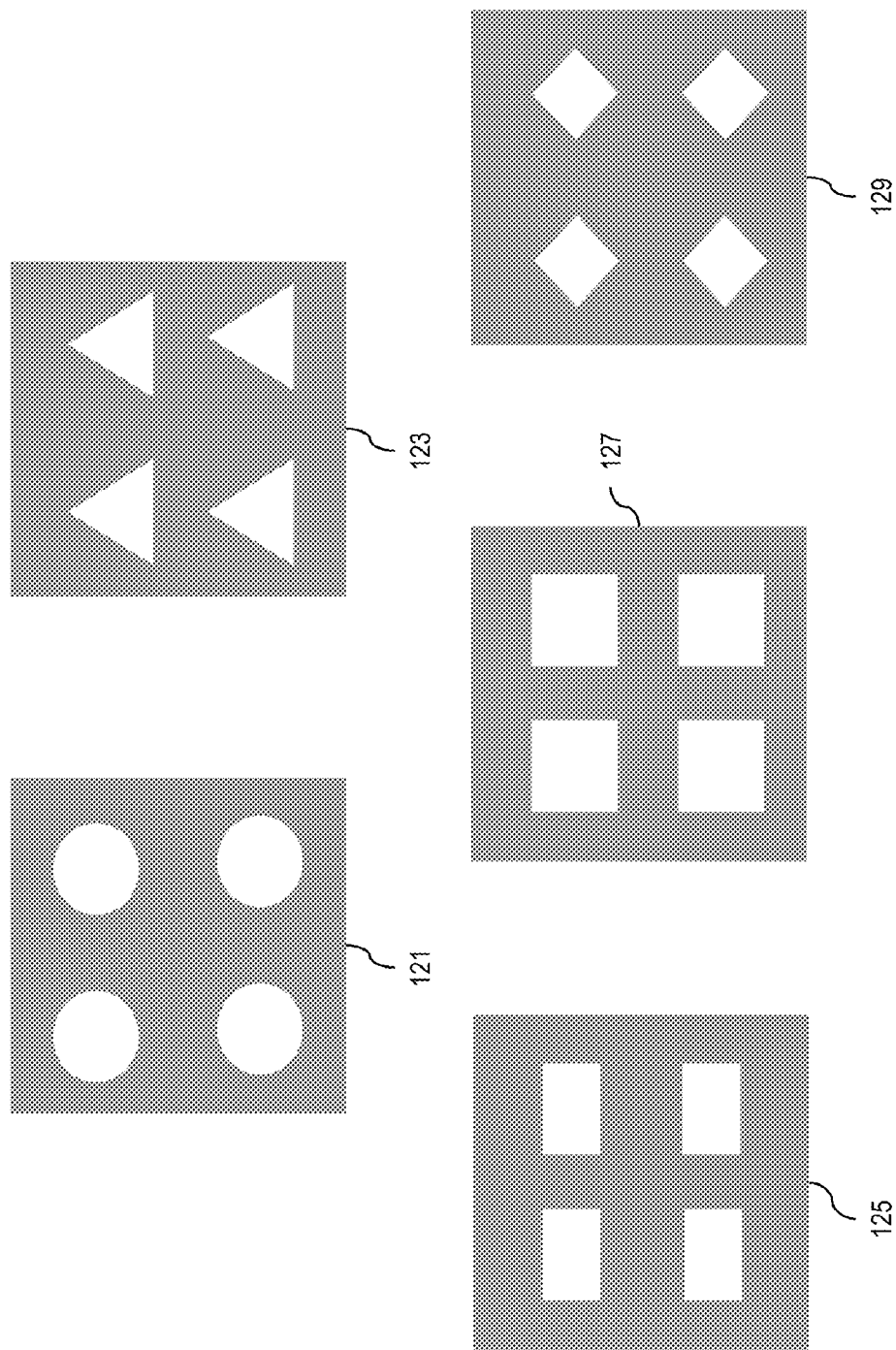
FIG. 1B illustrates top views of mask configurations for forming a three-dimensional NW, in accordance with an exemplary embodiment.

FIG. 1B illustrates masks configurations 121, 123, 125, 127, 129 that may be utilized in performing a directional etching of the 101 and 111 stacks, down to an upper surface of the Si substrate 109, to form a three-dimensional NW or an elongated FIN type narrow vertical structure (as for mask configuration 125) that may be in a shape of a mask utilized. The SiGe layers may be compressively strained such that after etching to NW dimensions there will be strain along the Z direction in those layers.

Figure 1D:
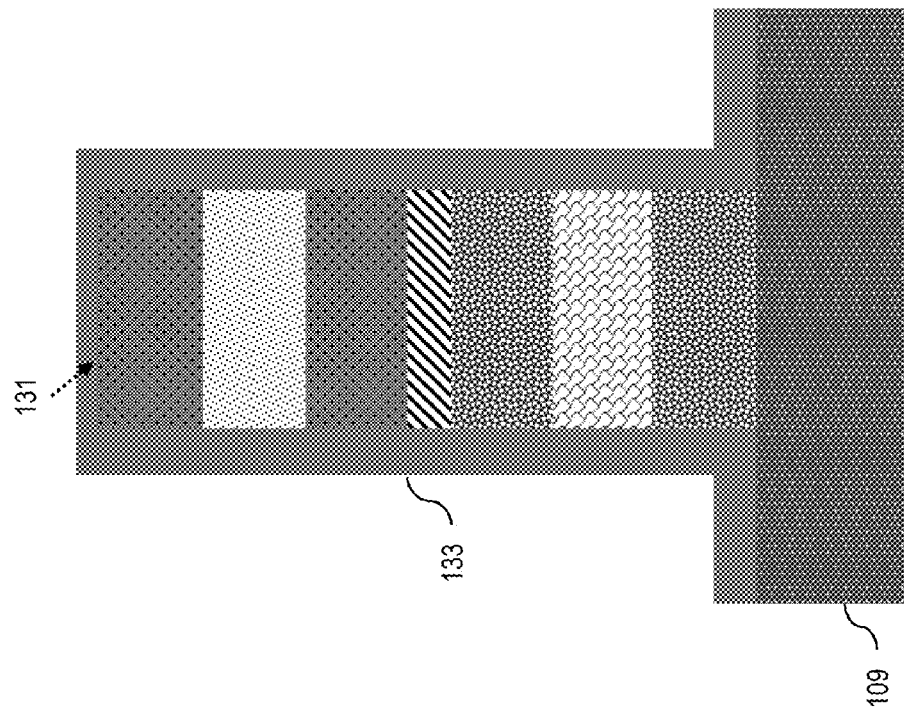
Figure 1C:
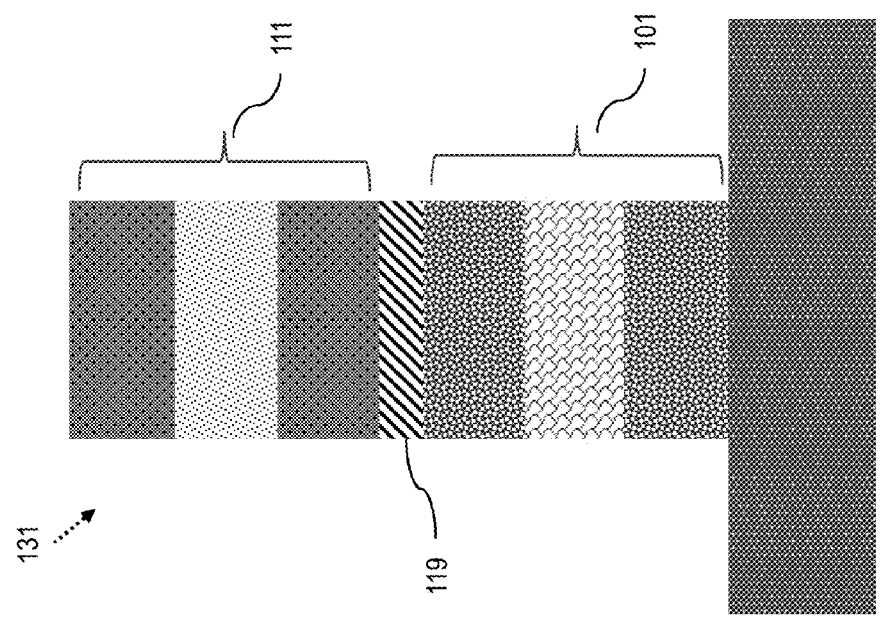

FIG. 1C illustrates a cross-sectional view of a NW 131 including the stacks 101 and 111 separated by the middle layer 119.

FIGS. 1D through 1P illustrate the process steps for formation of a first device (e.g. a NMOS transistor).

Adverting to FIG. 1D, a metallic material (e.g., nickel, tungsten, etc.) layer 133 may be conformally formed on exposed surfaces of the NW 131 and an upper surface of the Si substrate 109.

In FIG. 1E, an oxide layer 135 may be blanket deposited over exposed surfaces of the metallic layer 133 and then polished (e.g. by CMP) down to an upper surface of the metallic layer 133 on top of the NW 131.

As illustrated in FIG. 1F, the oxide layer 135 and portions of the metallic layer 133 are removed (e.g. etching) leaving a portion of the metallic layer 133 to form a first lower S/D region 137, on the upper surface of the Si substrate 109, surrounding a vertical section of exposed surfaces of the first doped Si layer 103.

In FIG. 1G, a first low-k dielectric layer 139 may be conformally formed on exposed surfaces of the NW 131 and an upper surface of the S/D region 137 surrounding another vertical section of the exposed surfaces of the first doped Si layer 103.

In FIG. 1H, an oxide layer 141 may be blanket deposited over exposed surfaces of the low-k dielectric layer 139 and then polished (e.g. by CMP) down to an upper surface of the low-k dielectric layer 139 on top of the NW 131.

As illustrated in FIG. 1I, the oxide layer 141 and portions of the low-k dielectric layer 139 are removed (e.g. by etching) leaving a portion of the low-k dielectric layer 139 on the upper surface of the S/D region 137 surrounding the other vertical section of the exposed surfaces of the first doped Si layer 103.

In FIG. 1J, a first gate dielectric (e.g. high-k) layer 143 may be conformally formed (e.g., by atomic layer deposition (ALD), chemical vapor deposition (CVD), etc.) on exposed surfaces of the NW 131 and an upper surface of the low-k dielectric 139.

As illustrated in FIG. 1K, selective etching may be utilized to remove sections of the first gate dielectric layer 143 exposing the top of the NW 131 and a section of the upper surface of the low-k dielectric 139.

In FIG. 1L, a metallic layer 145 layer may be conformally formed (e.g. by ALD) on exposed surfaces of the NW 131, the first gate dielectric layer 143, and the low-k dielectric layer 139 to form a gate-all-around (GAA) gate on a non-planar structure such as a vertical NW. The metal layer 145 may be an n-type work-function metal for an n-type device.

Adverting to FIG. 1M, an oxide layer 147 may be formed over exposed surfaces of the metallic layer 145 and then polished (e.g. by CMP) down to an upper surface of the metallic layer 145 on top of the NW 131.

As illustrated in FIG. 1N, portions of the oxide layer 147, the metallic layer 145, and the first gate dielectric layer 143 are removed (e.g. by etching) forming a first gate electrode 149 having a horizontal portion 149a on the exposed upper surface of the first low-k dielectric 139 and a vertical portion 149b on exposed side surfaces of a first gate dielectric 151 surrounding the first channel layer 105. A remaining portion of the oxide layer 147 forms a first isolation layer 153 on an upper surface of the horizontal portion 149a and coplanar with a top of the vertical portion 149b of the first gate electrode 149.

In FIG. 1O, processes similar to those in FIGS. 1G through 1I may be utilized to form a second low-k dielectric 155, on the top of the vertical portion 149b of the first gate electrode, the first gate dielectric 151, and an upper surface of the first isolation layer 153, surrounding a vertical section of exposed surfaces of the second doped Si layer 107.

In FIG. 1P, processes similar to those in FIGS. 1D through 1F may be utilized to form a second lower S/D region 157, on an upper surface of the second low-k dielectric 155, surrounding exposed surfaces of the second doped Si layer 107.

In FIG. 1Q, processes similar to those in FIGS. 1G through 1I may be utilized to form a third low-k dielectric 159, on an upper surface of the second lower S/D region 157, surrounding the middle layer 119. Next, processes similar to those in FIGS. 1D through 1F may be utilized to form a first upper S/D region 161, on an upper surface of the third low-k dielectric 159, surrounding a vertical section of the first doped SiGe layer 113. Processes similar to those in FIGS. 1G through 1I may be utilized to form a fourth low-k dielectric 163, on an upper surface of the first upper S/D region 161, surrounding another vertical section of the first doped SiGe layer 113.

In FIG. 1R, processes similar to those in FIGS. 1J through 1N may be utilized to form a second gate dielectric 165 on exposed surfaces of the second channel layer 115; a second gate electrode 167 (e.g. a p-type work-function metal for a PMOS device) having a horizontal portion 167a on an exposed upper surface of the fourth low-k dielectric 163 and a vertical portion 167b on exposed side surfaces of the second gate dielectric 165, and a second isolation layer 169 on an upper surface of the horizontal portion 167a and coplanar with a top of the vertical portion 167a of the second gate electrode 167.

Figures 1S, 1T:
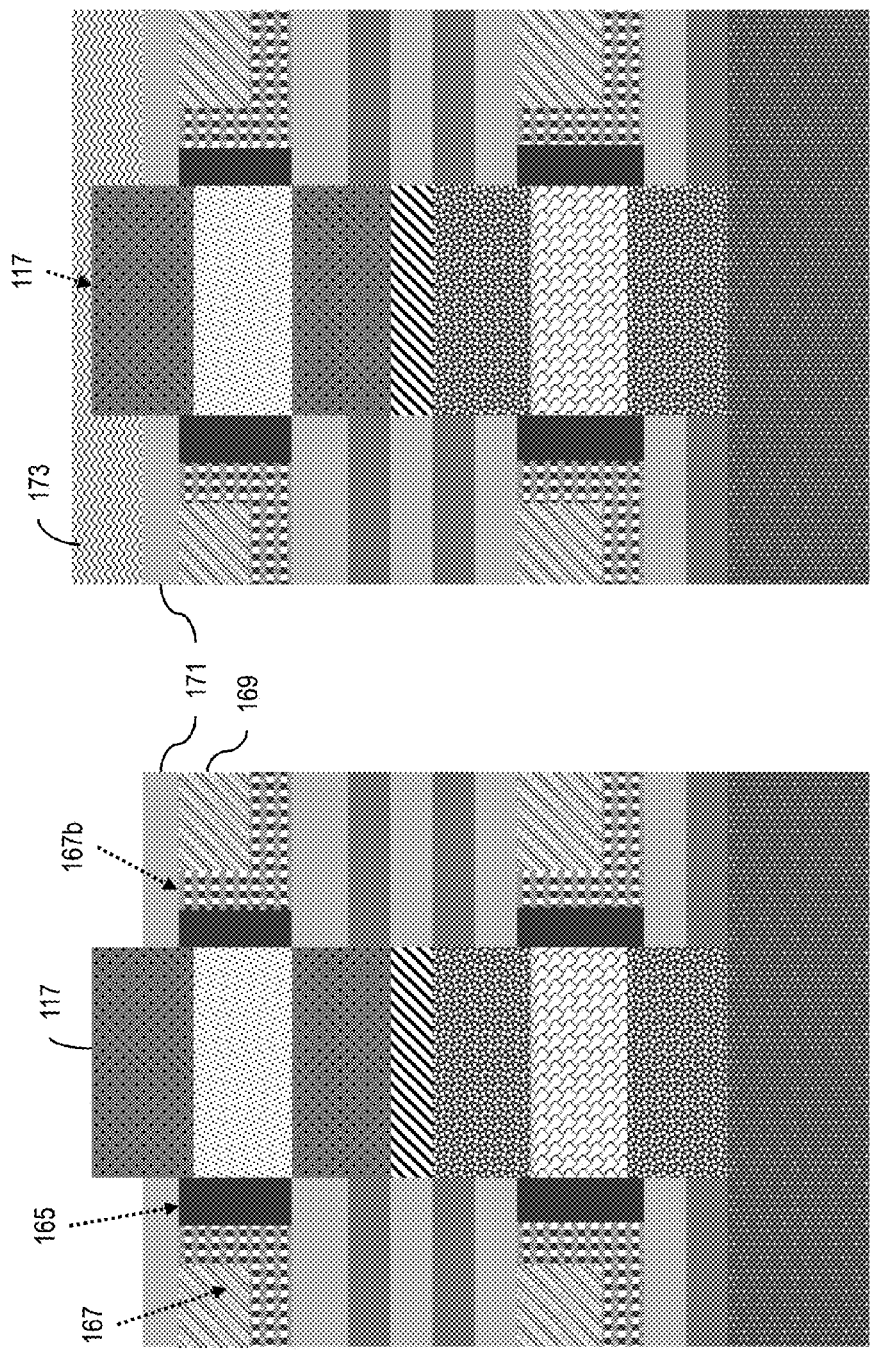

In FIG. 1S, processes similar to those in FIGS. 1G through 1I may be utilized to form a fifth low-k dielectric 171, on top of the vertical portion 167b of the second gate electrode 167, the second gate dielectric 165, and an upper surface of the second isolation layer 169, surrounding a vertical section of the second doped SiGe layer 117.

In FIG. 1T, a metal layer 173 is formed over the fifth low-k dielectric 171 and over and surrounding exposed surfaces of the second doped SiGe layer 117.

Figure 1U:
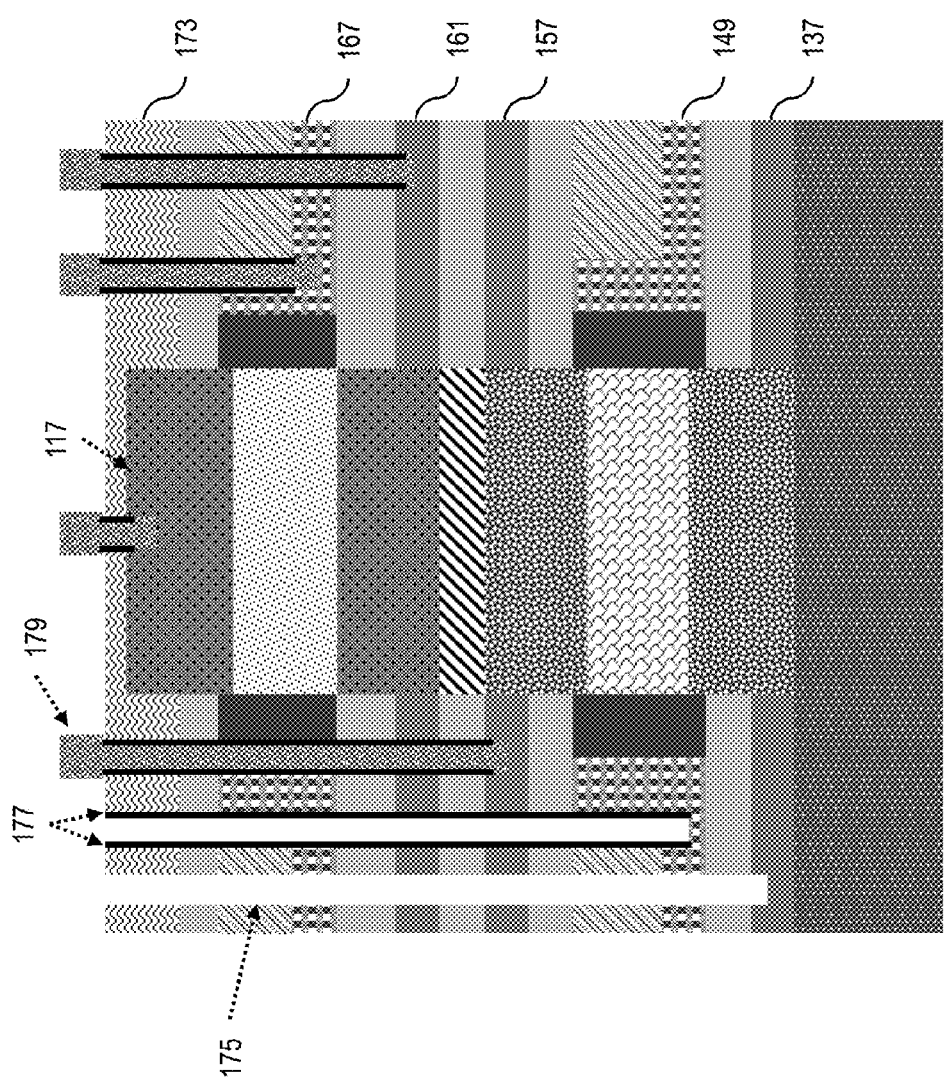
Figure 1A:
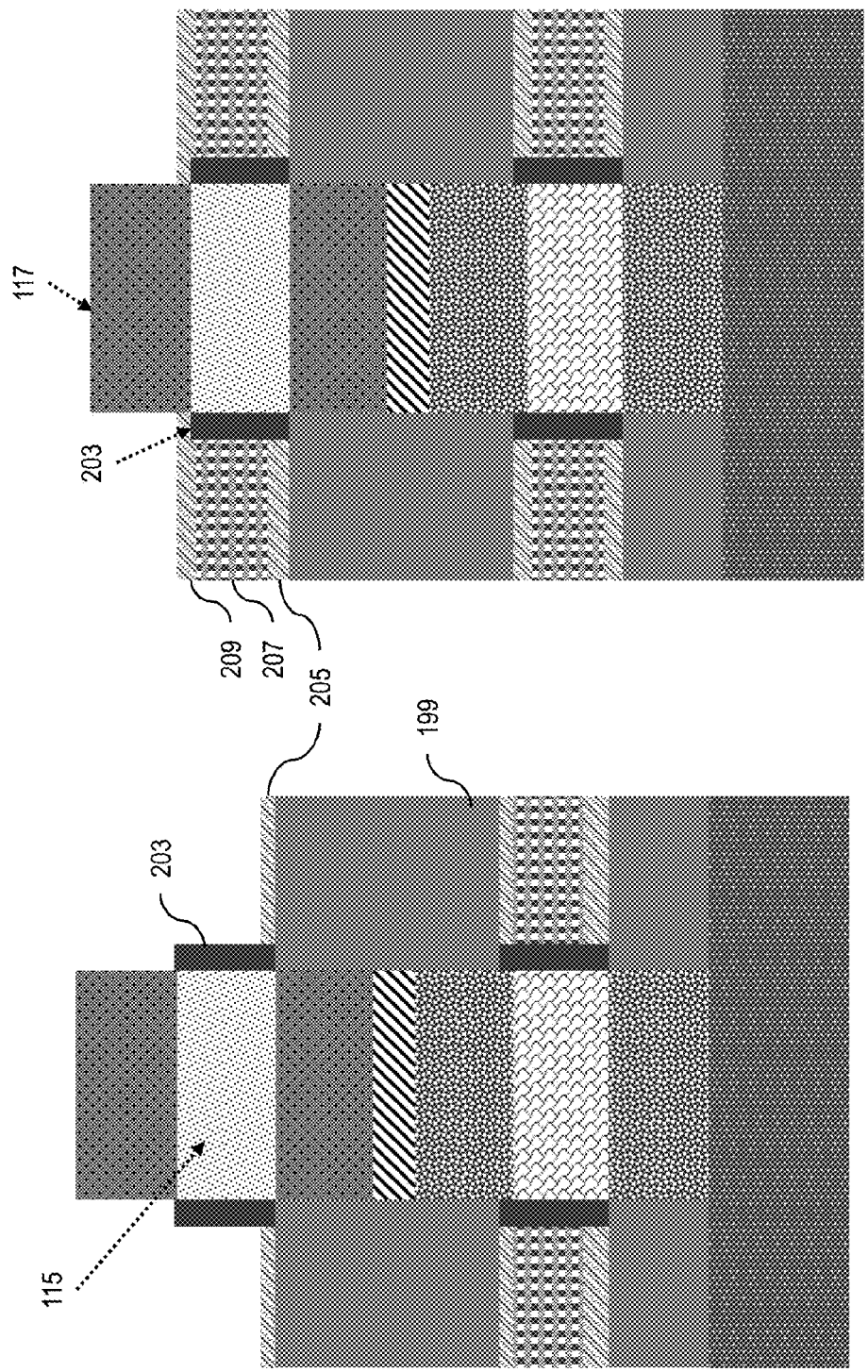
Figure 1A:
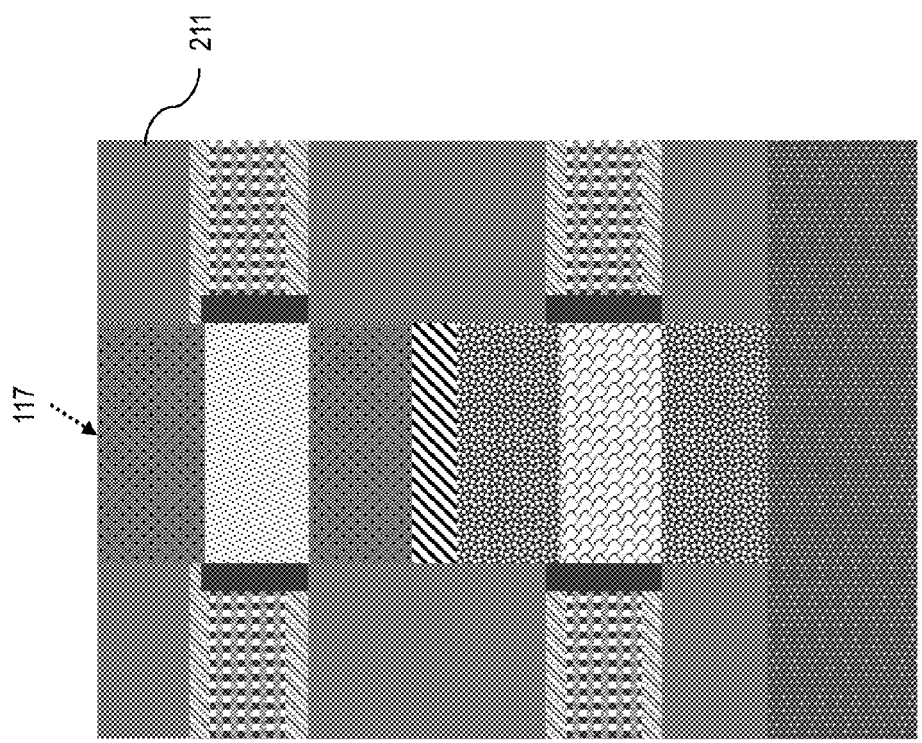
Figure 1A:
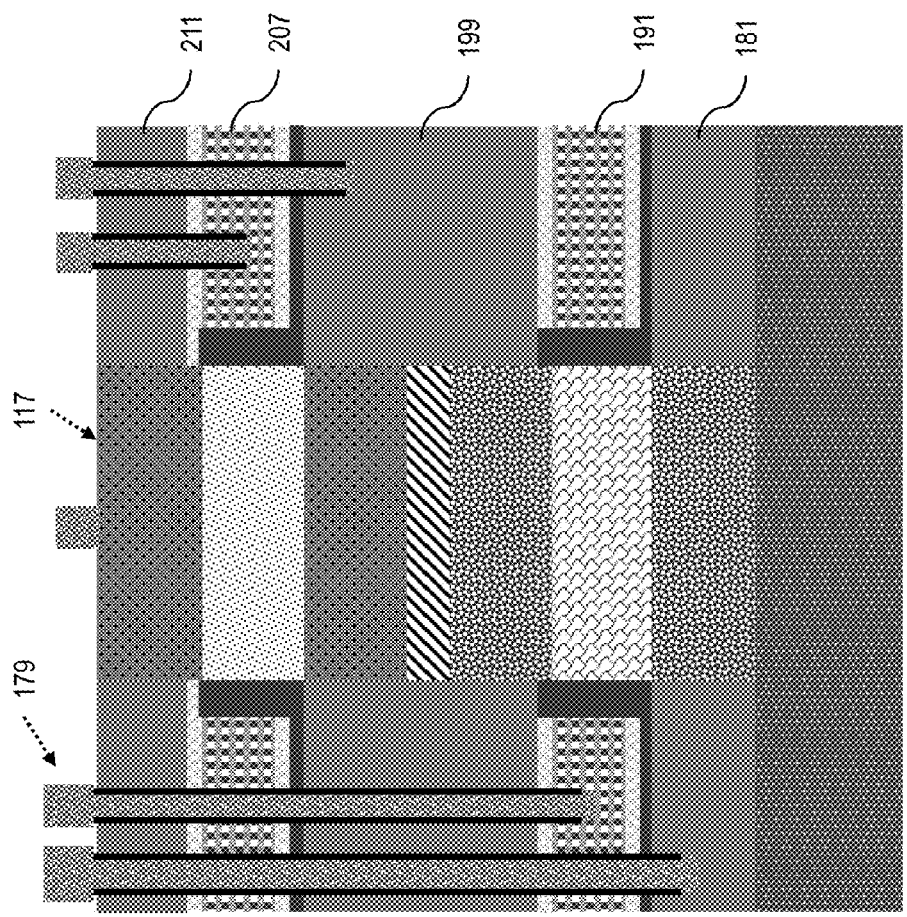

Adverting to FIG. 1U, a trench 175 is formed through the metal layer 173 and subsequent layers, as applicable, to each of the first and second lower S/D regions 137 and 157, respectively, the first and second gate electrodes 149 and 167, respectively, the first upper S/D region 161, and the second doped SiGe layer 117. Next, an isolation dielectric 177 is formed on sidewalls of the trenches 175, and each trench is filled with a conductive metallic material 179.

FIG. 1V illustrates an alternative scenario in which a first lower S/D region 181 is formed, on the upper surface of the Si substrate 109, surrounding the first doped Si layer 103. An annealing/silicidation process may be applied to the S/D region 181 to silicide the S/D region material.

In FIG. 1W, a first gate dielectric (e.g. high-k) layer 183 may be conformally formed on exposed surfaces of the NW 131. Next, a spacer oxide 185 may be deposited over exposed surfaces of the first gate dielectric layer 183 and an exposed upper surface of the first lower S/D region 181.

FIG. 1X illustrates, directional selective etching of the spacer oxide 185 and the gate dielectric layer 183, leaving a first gate dielectric 187 on exposed surfaces of the first channel layer 105 and sections of the second doped Si layer 107 adjacent the first channel layer 105. Also, after the directional selective etching, a first isolation layer 189 (e.g. oxide spacer) remains on the upper surface of the first lower S/D region 181, surrounding a lower vertical section of the first gate dielectric 187.

In FIG. 1Y, a first gate electrode material may be deposited on an exposed upper surface of the first isolation layer 189 and then etched down to form a first gate electrode 191 (e.g. n-type work-function metal for an NMOS device) surrounding exposed side surfaces of the first gate dielectric 187.

In FIG. 1Z, a second spacer oxide layer 193 may be deposited on exposed surfaces of the first gate electrode 191 and the gate dielectric 187.

As illustrated in FIG. 1AA, the second spacer oxide layer 193 is etched, leaving a second isolation layer 195 on an upper surface of the first gate electrode 191 and coplanar with an upper surface of the first gate dielectric 187.

As illustrated in FIG. 1AB, a second lower S/D region 197 is formed (e.g., by deposition and etching of a metal layer) on an upper surface of the second isolation layer 195 and an exposed upper surface of the first gate dielectric 187. Alternatively, a second lower S/D region 199 may be formed surrounding the second doped Si layer 107, the middle layer 119, and the first doped SiGe layer 113, forming joined second lower 197 and first upper 201 S/D regions. An annealing/silicidation process may be applied to the S/D region 199 to silicide the S/D region material. Further, depending on a thickness of the materials in the S/D regions, they may be in situ-doped or implanted with a dopant and annealed after formation of the S/D regions.

FIG. 1AC illustrates a scenario in which the first doped SiGe layer 113 is formed directly on the second doped Si layer 107 (e.g. there is no middle layer 119), wherein the joined second lower 197 and first upper 201 S/D regions (e.g. 199) surround the second doped Si layer 107 and the first doped SiGe layer 113.

In FIG. 1AD, processes similar to those in FIGS. 1W and 1X may be utilized to form a second gate dielectric 203 on exposed surfaces of the second channel layer 115 and a third isolation layer 205 on an exposed upper surface of the joined S/D region 199, surrounding a lower vertical section of the second gate dielectric 203.

In FIG. 1AE, processes similar to those in FIGS. 1Y and 1AA may be utilized to form a second gate electrode 207

(e.g. a p-type work-function metal for a PMOS device), on an exposed upper surface of the third isolation layer 205, surrounding exposed side surfaces of the second gate dielectric 203. A fourth isolation layer 209 is formed, on an upper surface of the second gate electrode 207 and an exposed upper surface of the second gate dielectric 203, surrounding a lower section of the second doped SiGe layer 117.

In FIG. 1AF, a second upper S/D region 211 is formed on an upper surface of the fourth isolation layer 209, coplanar with and surrounding exposed surfaces of the second doped SiGe layer 117. An annealing/silicidation process may be applied to the S/D region 211 to silicide the S/D region material In FIG. 1AG, processes similar to those in FIG. 1U may be utilized to form contacts 179 to each of the first lower S/D region 181, the joined S/D region 199, the first and second gate electrodes 191 and 207, respectively, and the second doped SiGe layer 117.

The embodiments of the present disclosure can achieve several technical effects including scaling IC devices (e.g. transistors); improving power, performance and density of scaled transistors; and reducing the number of mask levels. A NW (e.g. vertical) including transistors/inverters with active channels may be formed having alternate materials, by patterning hetero-structures that may be grown within a critical thickness of the active channel materials, where the channel materials in the structures may be pseudomorphic while maintaining strain. Further, the NW may be formed with in situ-doped S/D regions. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.), particularly for the 28 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    a vertical nanowire structure, along a three-dimensional plane, comprising:
        a first stack of semiconductor layers including a first doped silicon (Si) layer, a first channel layer, and a second doped Si layer, respectively, on a Si substrate;
        a second stack of semiconductor layers including a first doped silicon-germanium (SiGe) layer, a second channel layer, and a second doped SiGe layer, respectively, on the first stack;
    lower source/drain (S/D) regions and a lower gate-stack surrounding the first stack;
    upper S/D regions and an upper gate-stack surrounding the second stack; and
    contacts connected to the lower S/D regions, a first gate electrode, an upper S/D region, an upper gate electrode, and the second doped SiGe layer.

2. The device according to claim 1, wherein the first channel layer comprises Si and the second channel layer comprises strained SiGe or unstrained SiGe.

3. The device according to claim 1, further comprising a middle layer separating the first stack and the second stack, wherein the lower S/D regions and the lower gate-stack comprise:
    a first lower S/D region, on the upper surface of the Si substrate, surrounding a vertical section of exposed surfaces of the first doped Si layer;
    a first low-k dielectric, on an upper surface of the first lower S/D region, surrounding another vertical section of the exposed surfaces of the first doped Si layer;
    a first gate dielectric on exposed surfaces of the first channel layer,
        wherein the first gate electrode comprises a horizontal portion on an exposed upper surface of the first low-k dielectric and a vertical portion on exposed side surfaces of the first gate dielectric;
    a first isolation layer on an upper surface of the horizontal portion of the first gate electrode, coplanar with a top of the vertical portion of the first gate electrode;
    a second low-k dielectric on the top of the vertical portion of the first gate electrode, the first gate dielectric, and an upper surface of the first isolation layer, surrounding a vertical section of exposed surfaces of the second doped Si layer; and
    a second lower S/D region, on an upper surface of the second low-k dielectric, surrounding exposed surfaces of the second doped Si layer.

4. The device according to claim 3, wherein the upper S/D regions and the upper gate-stack comprise:
    a third low-k dielectric, on an upper surface of the second lower S/D region, surrounding the middle layer;
    a first upper S/D region, on an upper surface of the third low-k dielectric, surrounding a vertical section of the first doped SiGe layer;
    a fourth low-k dielectric, on an upper surface of the first upper S/D region, surrounding another vertical section of the first doped SiGe layer;
    a second gate dielectric on exposed surfaces of the second channel layer;
    a second gate electrode with a horizontal portion on an exposed upper surface of the fourth low-k dielectric and a vertical portion on exposed side surfaces of the second gate dielectric;
    a second isolation layer on an upper surface of the horizontal portion of the second gate electrode coplanar with a top of the vertical portion of the second gate electrode;
    a fifth low-k dielectric, on the top of the vertical portion of the second gate electrode, the second gate dielectric, and an upper surface of the second isolation layer, surrounding a vertical section of the second doped SiGe layer; and
    a metal layer over the fifth low-k dielectric and over and surrounding exposed surfaces of the second doped SiGe layer.

5. The device according to claim 1, wherein the contacts comprise:
    a trench extending to each of the first and second lower S/D regions, the first gate electrode and a second gate electrode, the first upper S/D region, and the second doped SiGe layer;

an isolation dielectric on sidewalls of the trenches; and
a conductive metal filling each trench.

6. The device according to claim 1, wherein the lower S/D regions and the lower gate stack comprise:
   a first lower S/D region, on the upper surface of the Si substrate, surrounding the first doped Si layer;
   a first gate dielectric on exposed surfaces of the first channel layer and sections of the first doped Si layer and the second doped Si layer adjacent the first channel layer;
   a first isolation layer, on an exposed upper surface of the first lower S/D region, surrounding a lower vertical section of the first gate dielectric,
      wherein the first gate electrode is formed, on an exposed upper surface of the first isolation layer, surrounding exposed side surfaces of the first gate dielectric;
   a second isolation layer, on an upper surface of the first gate electrode, coplanar with an upper surface of the first gate dielectric; and
   a second lower S/D region on an upper surface of the second isolation layer and an exposed upper surface of the first gate dielectric.

7. The device according to claim 6, wherein the upper S/D regions and the upper gate stack comprise:
   the second lower S/D region surrounding the second doped Si layer and the first doped SiGe layer, forming joined second lower and first upper S/D regions;
   a second gate dielectric on exposed surfaces of the second channel layer;
   a third isolation layer, on an exposed upper surface of the joined S/D region, surrounding a lower vertical section of the second gate dielectric;
   a second gate electrode, on an exposed upper surface of the second isolation layer, surrounding exposed side surfaces of the second gate dielectric;
   a fourth isolation layer, on an upper surface of the second gate electrode and an exposed upper surface of the second gate dielectric, surrounding a lower section of the second doped SiGe layer; and
   a second upper S/D region, on an upper surface of the fourth isolation layer, coplanar with and surrounding exposed surfaces of the second doped SiGe layer.

8. The device according to claim 7, further comprising a middle layer of carbon-doped Si separating the first stack and the second stack.

9. The device according to claim 7, wherein the contacts comprise:
   a trench extending to each of the first lower S/D region, the joined S/D region, the first gate electrode and the second gate electrode, and the second doped SiGe layer;
   an isolation dielectric on sidewalls of the trenches; and
   a conductive metal filling each trench.

10. A device comprising:
    a vertical nanowire structure, along a three-dimensional plane, comprising:
       a first stack of semiconductor layers including a first doped silicon (Si) layer, a first channel layer, and a second doped Si layer, respectively, on a Si substrate;
       a middle layer on the first stack;
       a second stack of semiconductor layers including a first doped silicon-germanium (SiGe) layer, a second channel layer, and a second doped SiGe layer, respectively, on the middle layer;
    lower source/drain (S/D) regions and a lower gate-stack surrounding the first stack;
    upper S/D regions and an upper gate-stack surrounding the second stack; and
    contacts connected to the lower S/D regions, a first gate electrode, an upper S/D region, an upper gate electrode, and the second doped SiGe layer.

11. The device according to claim 10, wherein a dopant of the first doped Si layer and the second doped Si layer comprises phosphorous (P) and a dopant of the first doped SiGe layer and the second doped SiGe layer comprises boron (B).

12. The device according to claim 10, wherein the middle layer comprises carbon-doped Si.

13. The device according to claim 10, wherein the lower S/D regions and the lower gate-stack comprise:
    a first lower S/D region, on the upper surface of the Si substrate, surrounding a vertical section of exposed surfaces of the first doped Si layer;
    a first low-k dielectric, on an upper surface of the first lower S/D region, surrounding another vertical section of the exposed surfaces of the first doped Si layer;
    a first gate dielectric on exposed surfaces of the first channel layer,
       wherein the first gate electrode comprises a horizontal portion on an exposed upper surface of the first low-k dielectric and a vertical portion on exposed side surfaces of the first gate dielectric;
    a first isolation layer on an upper surface of the horizontal portion of the first gate electrode, coplanar with a top of the vertical portion of the first gate electrode;
    a second low-k dielectric on the top of the vertical portion of the first gate electrode, the first gate dielectric, and an upper surface of the first isolation layer, surrounding a vertical section of exposed surfaces of the second doped Si layer; and
    a second lower S/D region, on an upper surface of the second low-k dielectric, surrounding exposed surfaces of the second doped Si layer.

14. The device according to claim 10, wherein the upper S/D regions and the upper gate-stack comprise:
    a third low-k dielectric, on an upper surface of the second lower S/D region, surrounding the middle layer;
    a first upper S/D region, on an upper surface of the third low-k dielectric, surrounding a vertical section of the first doped SiGe layer;
    a fourth low-k dielectric, on an upper surface of the first upper S/D region, surrounding another vertical section of the first doped SiGe layer;
    a second gate dielectric on exposed surfaces of the second channel layer;
    a second gate electrode with a horizontal portion on an exposed upper surface of the fourth low-k dielectric and a vertical portion on exposed side surfaces of the second gate dielectric;
    a second isolation layer on an upper surface of the horizontal portion of the second gate electrode coplanar with a top of the vertical portion of the second gate electrode;
    a fifth low-k dielectric, on the top of the vertical portion of the second gate electrode, the second gate dielectric, and an upper surface of the second isolation layer, surrounding a vertical section of the second doped SiGe layer; and
    a metal layer over the fifth low-k dielectric and over and surrounding exposed surfaces of the second doped SiGe layer.

15. The device according to claim 10, wherein the contacts comprise:

a trench extending to each of the first and second lower S/D regions, the first gate electrode and the second gate electrode, the first upper S/D region, and the second doped SiGe layer;

an isolation dielectric on sidewalls of the trenches; and a conductive metal filling each trench.

16. A device comprising:
   a vertical nanowire structure, along a three-dimensional plane, comprising:
      a first stack of semiconductor layers including a first phosphorous (P) doped silicon (Si) layer, a first channel layer, and a second P doped Si layer, respectively, on a Si substrate;
      a second stack of semiconductor layers including a first boron (B) doped silicon-germanium (SiGe) layer, a second channel layer, and a second B doped SiGe layer, respectively, on the first stack;
      lower source/drain (S/D) regions and a lower gate-stack surrounding the first stack;
      upper S/D regions and an upper gate-stack surrounding the second stack; and
      contacts connected to the lower S/D regions, a first gate electrode, an upper S/D region, an upper gate electrode, and the second B doped SiGe layer.

17. The device according to claim 16, wherein the lower S/D regions and the lower gate stack comprise:
   a first lower S/D region, on the upper surface of the Si substrate, surrounding the first P doped Si layer;
   a first gate dielectric on exposed surfaces of the first channel layer and sections of the first P doped Si layer and the second P doped Si layer adjacent the first channel layer;
   a first isolation layer, on an exposed upper surface of the first lower S/D region, surrounding a lower vertical section of the first gate dielectric,
      wherein the first gate electrode is formed, on an exposed upper surface of the first isolation layer, surrounding exposed side surfaces of the first gate dielectric;
   a second isolation layer, on an upper surface of the first gate electrode, coplanar with an upper surface of the first gate dielectric; and
   a second lower S/D region on an upper surface of the second isolation layer and an exposed upper surface of the first gate dielectric.

18. The device according to claim 17, wherein the upper S/D regions and the upper gate stack comprise:
   the second lower S/D region surrounding the second P doped Si layer and the first B doped SiGe layer, forming joined second lower and first upper S/D regions;
   a second gate dielectric on exposed surfaces of the second channel layer;
   a third isolation layer, on an exposed upper surface of the joined S/D region, surrounding a lower vertical section of the second gate dielectric;
   a second gate electrode, on an exposed upper surface of the second isolation layer, surrounding exposed side surfaces of the second gate dielectric;
   a fourth isolation layer, on an upper surface of the second gate electrode and an exposed upper surface of the second gate dielectric, surrounding a lower section of the second B doped SiGe layer; and
   a second upper S/D region, on an upper surface of the fourth isolation layer, coplanar with and surrounding exposed surfaces of the second B doped SiGe layer.

19. The device according to claim 18, further comprising a middle layer of carbon-doped Si separating the first stack and the second stack.

20. The device according to claim 18, wherein the contacts comprise:
   a trench extending to each of the first lower S/D region, the joined S/D region, the first gate electrode and the second gate electrode, and the second B doped SiGe layer;
   an isolation dielectric on sidewalls of the trenches; and
   a conductive metal filling each trench.

* * * * *